United States Patent
Chang et al.

(10) Patent No.: US 12,243,743 B2
(45) Date of Patent: Mar. 4, 2025

(54) METHOD FOR PREPARING SEMICONDUCTOR DEVICE

(71) Applicant: CHANGXIN MEMORY TECHNOLOGIES, INC., Hefei (CN)

(72) Inventors: Susheng Chang, Hefei (CN); Tianlei Mu, Hefei (CN); Bin Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 651 days.

(21) Appl. No.: 17/487,711

(22) Filed: Sep. 28, 2021

(65) Prior Publication Data
US 2023/0005746 A1    Jan. 5, 2023

Related U.S. Application Data

(63) Continuation of application No. PCT/CN2021/106443, filed on Jul. 15, 2021.

(30) Foreign Application Priority Data

Jul. 2, 2021   (CN) .......................... 202110748574.7

(51) Int. Cl.
*H01L 21/033* (2006.01)
*H01L 21/027* (2006.01)
(Continued)

(52) U.S. Cl.
CPC ...... *H01L 21/0337* (2013.01); *H01L 21/0273* (2013.01); *H01L 21/0276* (2013.01); *H01L 21/3086* (2013.01); *H10B 12/09* (2023.02)

(58) Field of Classification Search
CPC ............... G03F 7/2022; G03F 7/70433; G03F 7/70466; H01L 21/027; H01L 21/0332; H01L 21/0334

See application file for complete search history.

(56) References Cited

U.S. PATENT DOCUMENTS

| 11,217,457 B2 | 1/2022 | Kim et al. |
| 2009/0162951 A1* | 6/2009 | Orimoto ................ H10B 41/30 |
| | | 257/E21.528 |
| 2021/0050221 A1 | 2/2021 | Kim et al. |

FOREIGN PATENT DOCUMENTS

| CN | 106158594 A | 11/2016 |
| CN | 104952782 B | 12/2018 |

(Continued)

OTHER PUBLICATIONS

CN 104952782, English Machine Translation (Year: 2024).*

*Primary Examiner* — Jose R Diaz
(74) *Attorney, Agent, or Firm* — Syncoda LLC; Feng Ma

(57) ABSTRACT

A method for preparing a semiconductor device is provided. The method for preparing the semiconductor device includes: providing a substrate, and forming a first dielectric layer on one side of the substrate, where the substrate includes an array area and a peripheral area arranged outside of the array area; forming an initial mask pattern on one side of the first dielectric layer away from the substrate; performing at least two patterning processes on the initial mask pattern, to form a first mask pattern in the array area and to form a second mask pattern in the peripheral area. The first mask pattern has a first height, the second mask pattern has a second height, and the second height is greater than the first height. Both of the array area and the peripheral area are exposed by using each of the at least two patterning processes.

4 Claims, 16 Drawing Sheets

(51) Int. Cl.
*H01L 21/308* (2006.01)
*H10B 12/00* (2023.01)

(56) References Cited

FOREIGN PATENT DOCUMENTS

| | | |
|---|---|---|
| CN | 109062011 A | 12/2018 |
| KR | 20040060310 A | 7/2004 |
| KR | 20080084423 A | 9/2008 |

\* cited by examiner

METHOD FOR PREPARING SEMICONDUCTOR DEVICE

CROSS-REFERENCE TO RELATED APPLICATIONS

This is a continuation of International Application No. PCT/CN2021/106443, filed on Jul. 15, 2021 and entitled "Method for Preparing Semiconductor Device and Semiconductor Device", which claims priority to Chinese Patent Application No. 202110748574.7, filed on Jul. 2, 2021 and entitled "Method for Preparing Semiconductor Device and Semiconductor Device". The disclosures of International Application No. PCT/CN2021/106443 and Chinese Patent Application No. 202110748574.7 are hereby incorporated by reference in their entireties.

TECHNICAL FIELD

The present application relates to the technical field of semiconductor devices, and particularly, to a method for preparing a semiconductor device.

BACKGROUND

A Dynamic Random Access Memory (DRAM) is a semiconductor memory widely used in a multicomputer system. With continuous reduction of feature sizes of semiconductor integrated circuit devices, the critical dimensions of the DRAMs are getting smaller and smaller, the manufacturing process becomes more and more complex, and the electrical requirements of the semiconductor integrated circuit devices are getting higher and higher.

SUMMARY

Embodiments of the disclosure provide a method for preparing a semiconductor device.

The method for preparing the semiconductor device provided by the embodiments of the disclosure includes:

providing a substrate, and forming a first dielectric layer on one side of the substrate, where the substrate comprises an array area and a peripheral area arranged outside of the array area;

forming an initial mask pattern on the first dielectric layer; and performing at least two patterning processes on the initial mask pattern, to form a first mask pattern in the array area and to form a second mask pattern in the peripheral area; where the first mask pattern has a first height, the second mask pattern has a second height, and the second height is greater than the first height; both of the array area and the peripheral area are exposed by using each of the at least two patterning processes.

BRIEF DESCRIPTION OF THE DRAWINGS

In order to better clarify the technical solution of embodiments of the disclosure or the conventional technology, the drawings required to illustrate the embodiments or the conventional technology will be simply described blow. It is apparent that the drawings described below merely illustrate some embodiments of the disclosure. Those of ordinary skill in the art can obtain other drawings without creative labor on the basis of those drawings.

DETAILED DESCRIPTION

Figure 1:
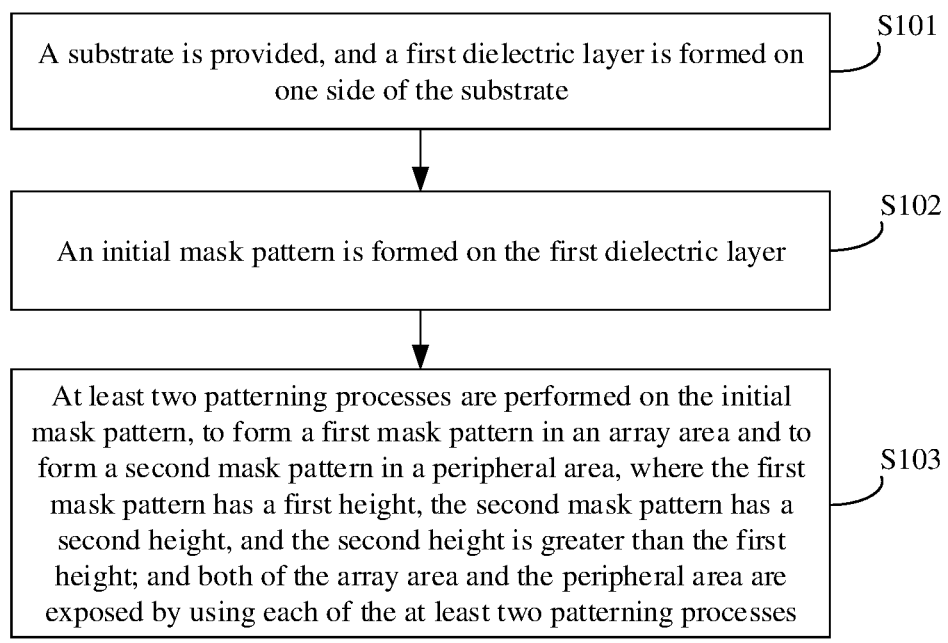
FIG. 1 is a schematic flowchart of a method for preparing a semiconductor device according to an embodiment of the disclosure.

In order to make objectives, technical solutions, and advantages of the disclosure of the embodiments of the disclosure clearer, the technical solutions of the embodiments of the disclosure will be described clearly and completely in conjunction with the accompanying drawings. Apparently, the described embodiments are part of the embodiments of the disclosure, rather than all of the embodiments. In addition, if there is no conflict, the embodiments of the disclosure and features in the embodiments may be combined each other. Based on the described embodiments of the disclosure, all other embodiments obtained by those of ordinary skill in the art without creative efforts shall fall within the protection scope of the disclosure.

Unless otherwise defined, the technical terms or scientific terms used in the disclosure shall have a common meanings understood by those of ordinary in the art of the disclosure. The word of "first", "second", and similar words used in the disclosure do not denote any order, quantity or importance, but are only used to distinguish different components. The word of "include", "comprise", or similar words are intended to indicate that the elements or objects preceding the words cover the elements or objects and their equivalents listed after the words, without excluding other elements or objects. The word of "connect", "interconnect", or similar words are not limited to physical or mechanical connection, but may include electrical connection, either direct or indirect.

It should be noted that the dimensions and shapes of the various figures in the accompanying drawings do not reflect true scale and are only intended to illustrate the contents of the disclosure. The same or similar reference numerals refer to the same or similar elements or elements having the same or similar functions.

According to an embodiment of the disclosure, a method for preparing a semiconductor device is provided. As shown in FIG. 1, the method includes the following operations S101 to S103.

At the operation of S101, a substrate is provided, and a first dielectric layer is formed on one side of the substrate. The substrate includes an array area and a peripheral area arranged outside of the array area.

At the operation of S102, an initial mask pattern is formed on the first dielectric layer.

At the operation of S103, at least two patterning processes are performed on the initial mask pattern, to form a first mask pattern in the array area and to form a second mask pattern in the peripheral area. The first mask pattern has a first height. The second mask pattern has a second height. The second height is greater than the first height. Both of the array area and the peripheral area are exposed by each of the at least two patterning processes.

It should be noted that an optical proximity effect is that the energy distribution and phase distribution of an image intensity spectrum have a certain distortion relative to an ideal image spectrum due to the nonlinear spatial filtering during a partially coherent imaging process. And finally the imaging quality is greatly reduced, i.e., the optical proximity effect is induced. The ideal image intensity spectrum distribution depends on the characteristic size, shape and distribution law of the lines on the mask, and the corners or the sharp lines provide more high-frequency components for the spectrum. However, due to the limitation of diffraction, these high-frequency components cannot reach the corners corresponding to an actual spatial image plane through the system, which will inevitably lead to the mismatch of light intensity distribution of a spatial image at the corners, so as to cause rounding or distortion of the lines of the actual spatial image at the corners.

According to the method for preparing the semiconductor device according to an embodiment of the disclosure, a complete mask pattern may be obtained by at least two patterning processes including the exposure, i.e., the mask pattern in the peripheral area may be split, and a complex mask pattern may be split into a plurality of simple patterns for exposing for several times. Therefore, the optical proximity effect can be reduced, the rounded corners of the mask pattern in the peripheral area can be avoided, and the appearance of the mask pattern of the peripheral area can be improved, thereby improving the manufacturing yield of the mask pattern in the peripheral area, and also reducing the leakage current of the semiconductor device.

It should be noted that, in the method for preparing the semiconductor device according to an embodiment of the disclosure, the at least two patterning processes may be performed on the initial mask pattern to form the first mask pattern and the second mask pattern, and subsequently the first mask pattern and the second mask pattern may be transferred to the first dielectric layer and the substrate sequentially by taking the first mask pattern and the second mask pattern as a mask. The areas, corresponding to the first mask pattern and the second mask pattern, on the substrate may be active areas of the semiconductor. And the area, other than the first mask pattern and the second mask pattern, on the substrate may be a conductive area (i.e., a source and drain contact area).

In some embodiments, at the operation of S101, the first dielectric layer may be formed on one side of a substrate. For example, at the operation of S101, a material of the first dielectric layer may be deposited to form the first dielectric layer.

In some embodiments, as shown in FIGS. 2, 3, 4, and 5, the operation for forming the initial mask pattern on the side of the first dielectric layer away from the substrate, may specifically include the following operations S1021 to S1024.

At the operation of S1021, a first mask layer 5 may be formed on the first dielectric layer 4.

At the operation of S1022, the first mask layer 5 in the array area 1 may be removed by using the patterning processes.

At the operation of S1023, a second mask layer 31 that covers the array area 1 and the peripheral area 2 may be formed.

At the operation of S1024, an initial pattern in the array area may be formed on the second mask layer 31 in the array area 1 by using the patterning processes, and the first mask layer 5 and the second mask layer 31 in the peripheral area 2 may be reserved, so as to obtain an initial mask pattern 6.

Figure 2:
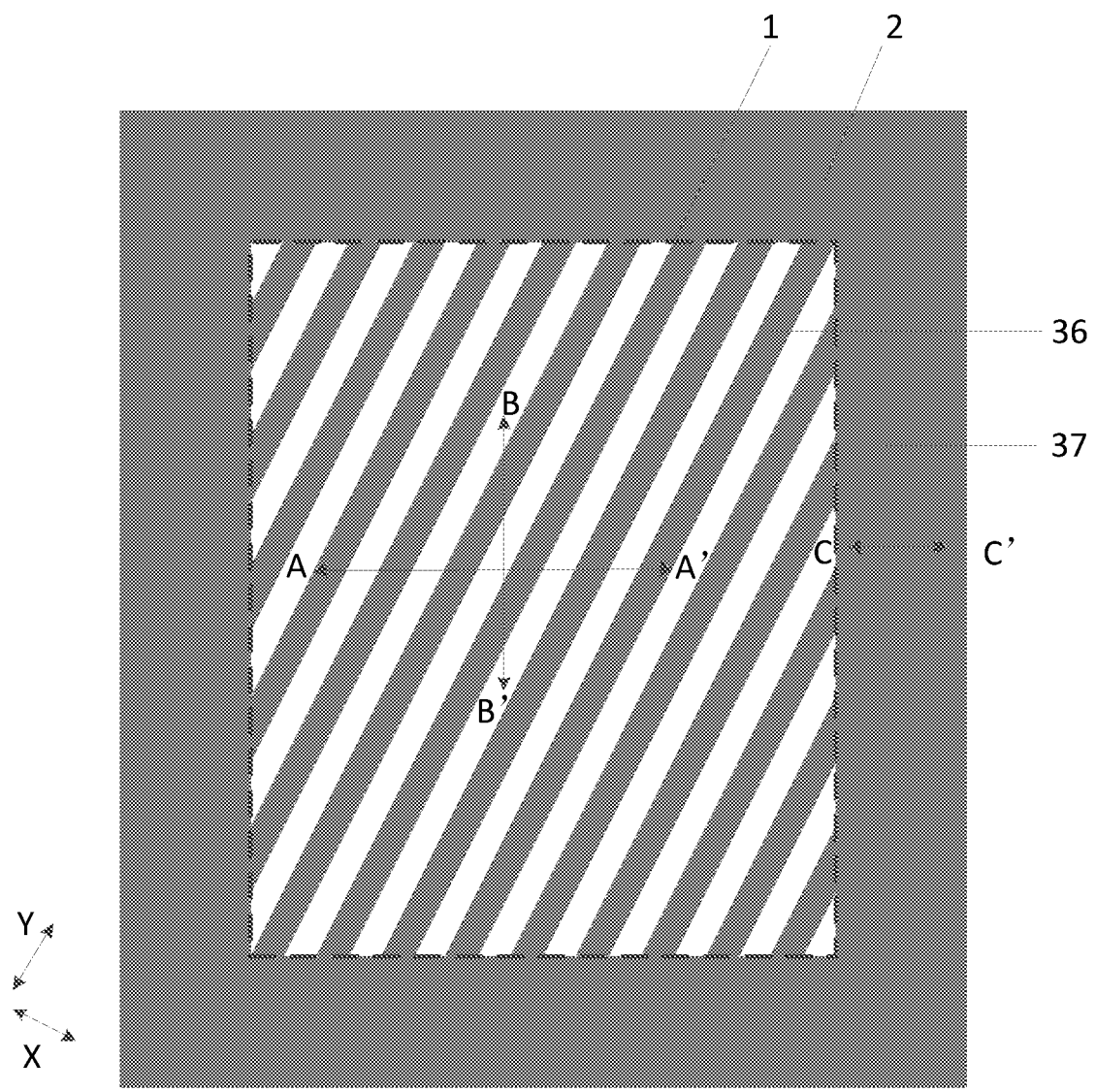
FIG. 2 is a schematic diagram of an initial mask pattern according to an embodiment of the disclosure.
Figure 3:
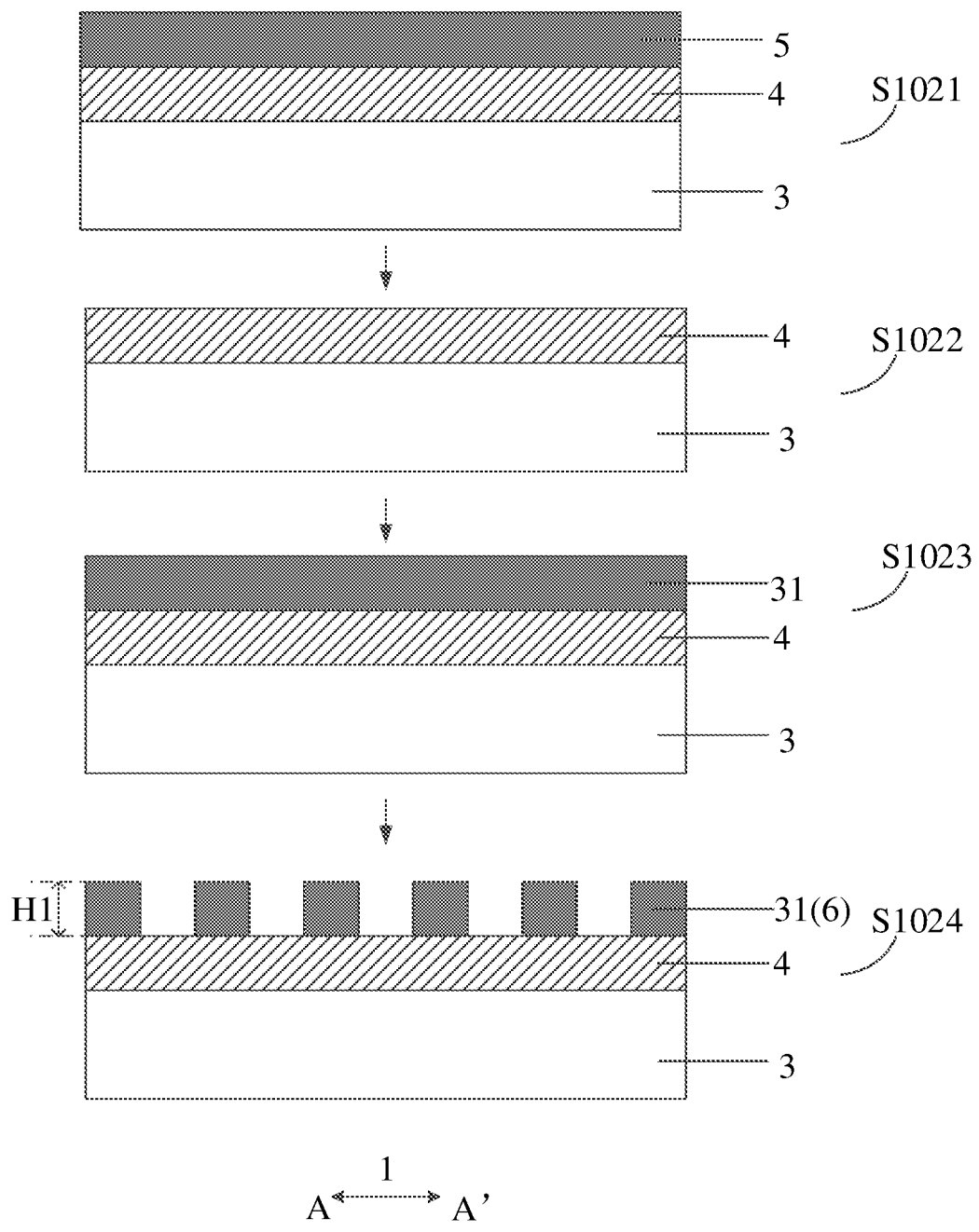
FIG. 3 is a schematic flowchart of a process for forming the initial mask pattern on a cross section corresponding to AN according to an embodiment of the disclosure.
Figure 4:
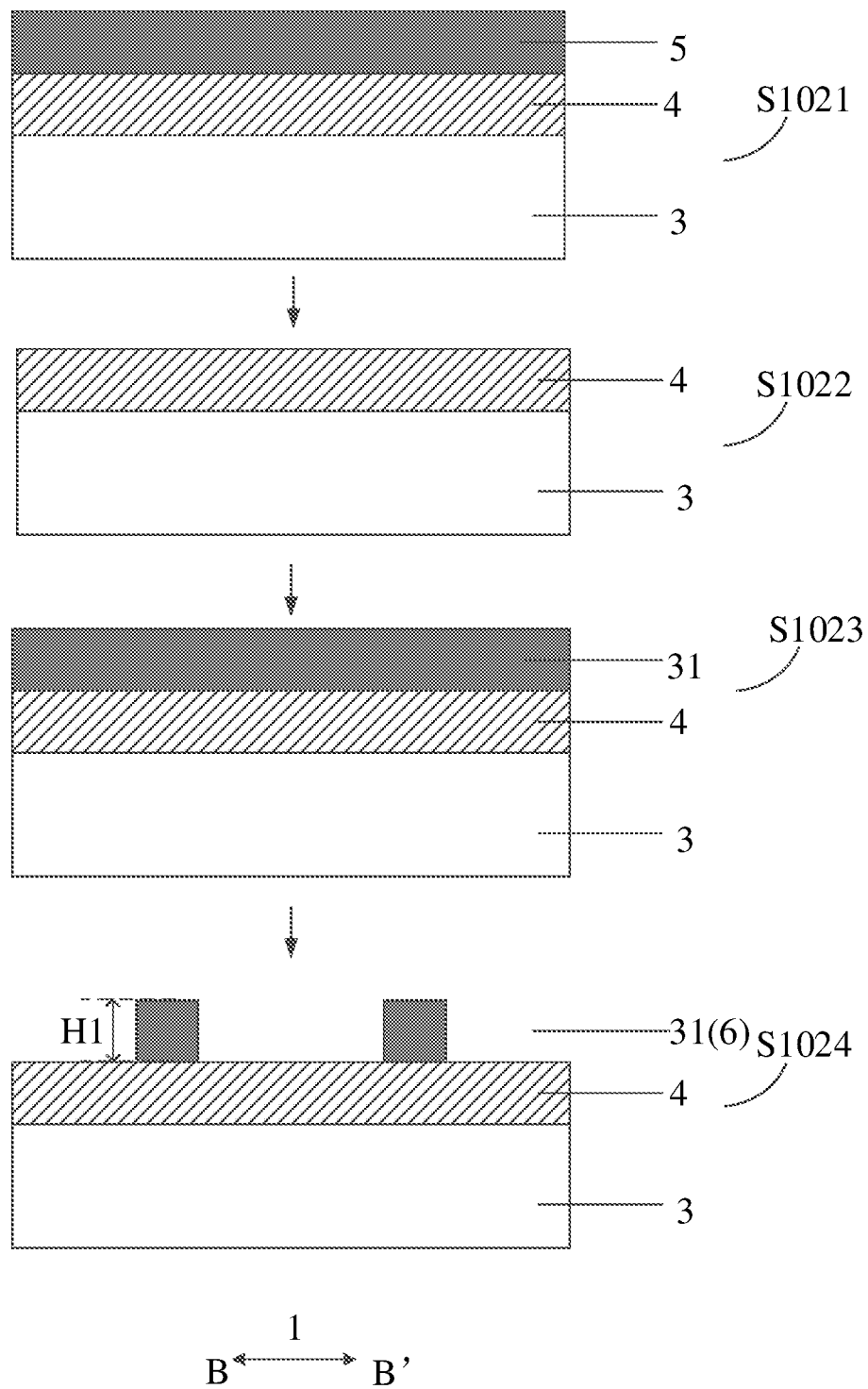
FIG. 4 is a schematic flowchart of a process for forming the initial mask pattern on a cross section corresponding to BB' according to an embodiment of the disclosure.
Figure 5:
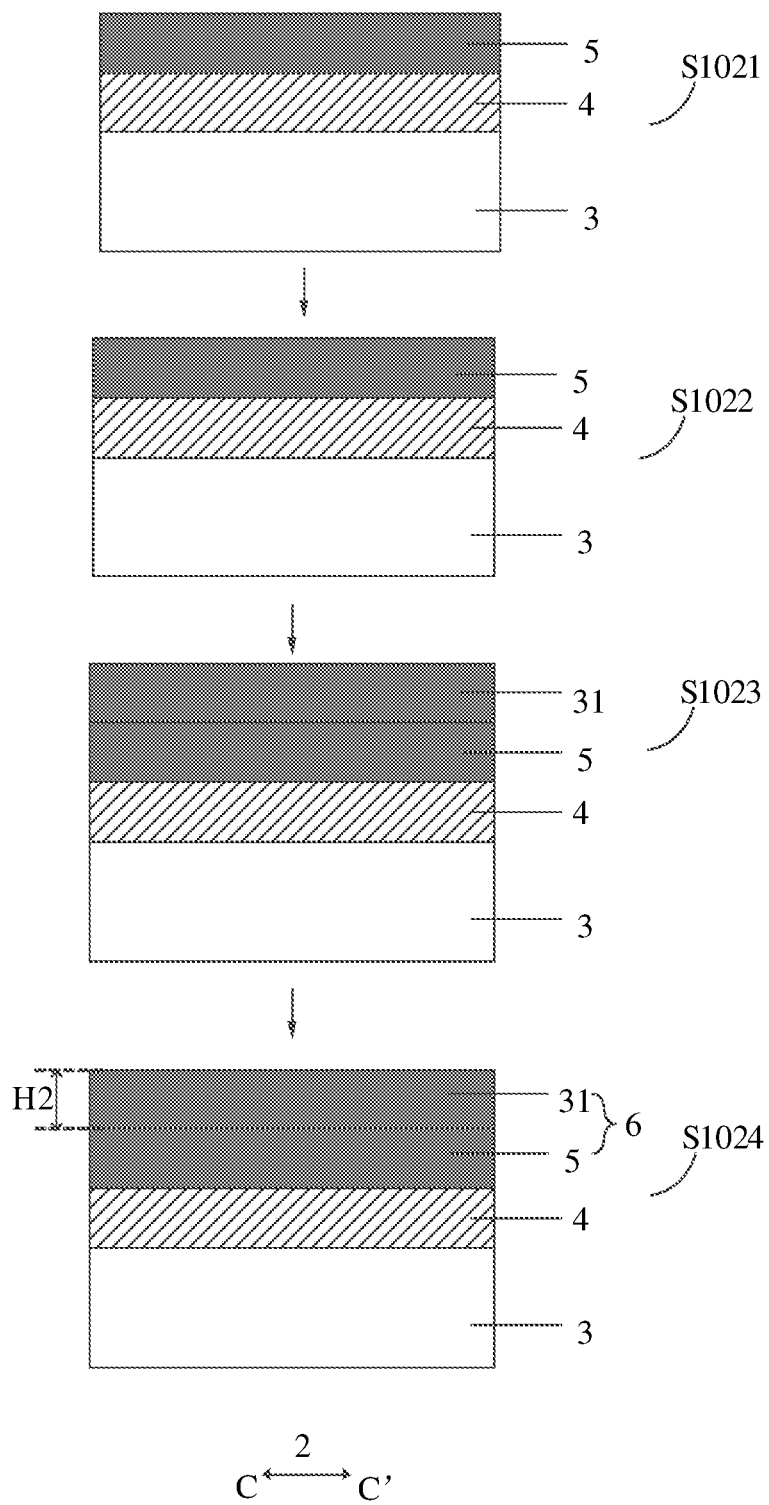
FIG. 5 is a schematic flowchart of a process for forming the initial mask pattern on a cross section corresponding to CC' according to an embodiment of the disclosure.

It should be noted that, FIG. 2 may be, for example, a front projection of the initial mask pattern on the substrate. The structure formed by the operation of S1024 in FIG. 3 may be, for example, a cross section along AA' in FIG. 2. The structure formed by the operation of S1024 in FIG. 4 may be, for example, a cross section along BB' in FIG. 2. The structure formed by the operation of S1024 in FIG. 5 may be, for example, a cross section along CC' in FIG. 2.

According to the method for preparing the semiconductor device according to an embodiment of the disclosure, the first mask layer in the array area may be removed after the first mask layer being formed for the first time, and then the second mask layer that covers the array area and the peripheral area may be formed. Therefore, a thickness of the initial mask pattern in the peripheral area may be greater than a thickness of the initial mask pattern in the array area, which facilitates subsequent formation of the second mask pattern in the peripheral area by using the at least two patterning processes.

In some embodiments, after the first mask layer being formed on the side of the first mask layer away from the first dielectric layer, a thickness H1 of the first mask layer in the array area and a total thickness H2 of two first mask layers in the peripheral area may satisfy a condition that: a ratio of H1 to H2 is greater than or equal to ¼ and less than or equal to ¾.

In some embodiments, a thickness of the second mask layer may be equal to a first height.

A total thickness of the first mask layer and the second mask layer may be equal to a second height.

In some embodiments, a material of the first mask layer may be the same as a material of the second mask layer.

In some embodiments, the material of the first mask layer and the material of the second mask layer may include Polyethylene (PE).

In the specific implementation, for example, the first mask layer and the second layer may be formed by using a deposition process. That is, at the operation of S1021, the material of the first mask layer may be deposited on the side of the first dielectric layer away from the substrate, to form the first mask layer. At the operation of S1023, the material of the second mask layer material may be deposited to form the second mask layer that covers the array area and the peripheral area.

Figure 6:
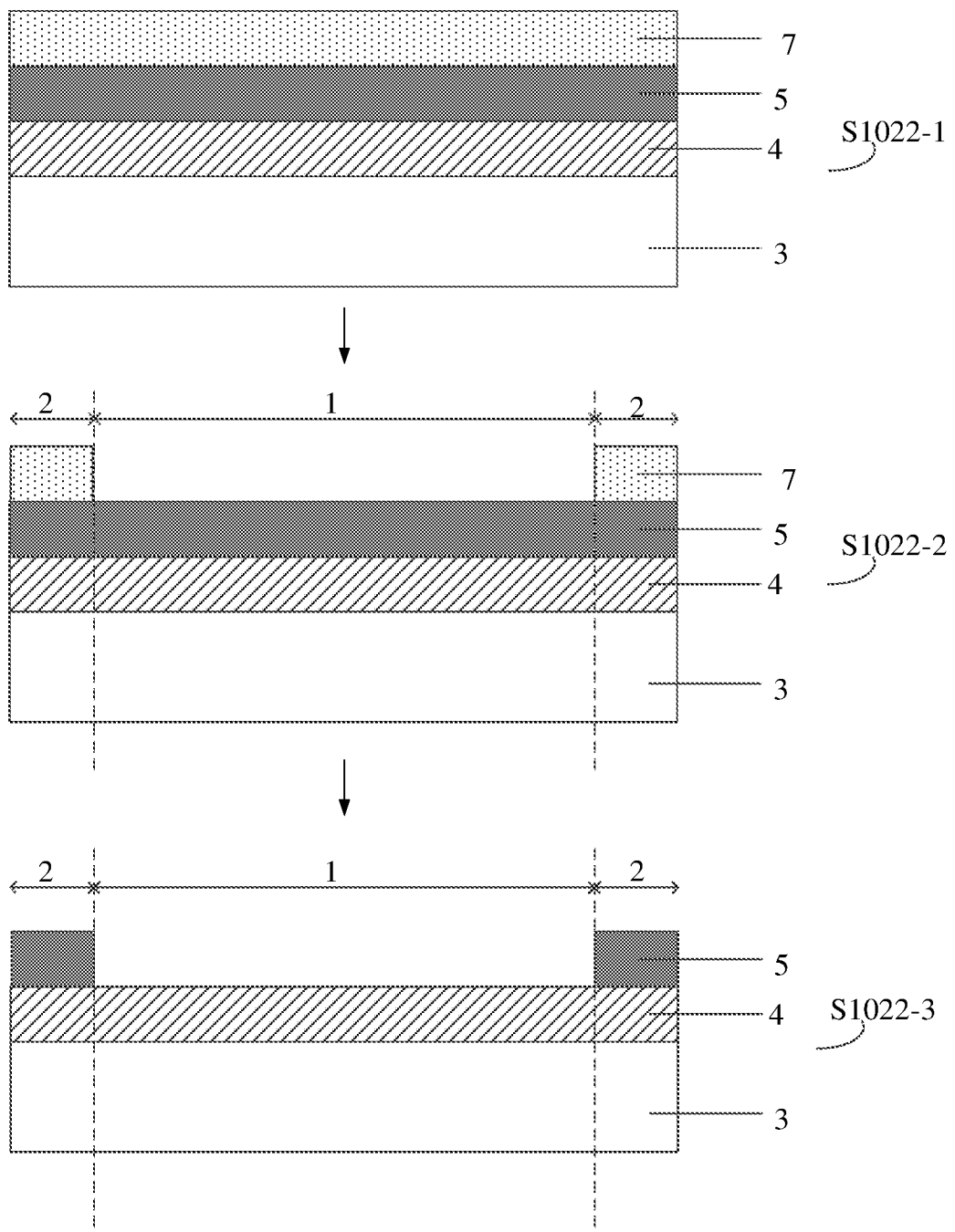
FIG. 6 is a schematic flowchart of an operation of S1022 in a method for preparing a semiconductor device according to an embodiment of the disclosure.

It should be noted that the patterning processes may include, for example, steps of coating the photoresist, exposing and developing the photoresist, etching the photoresist, removing the photoresist, etc. In some embodiments, as shown in FIG. 6, the operation of S1022 for removing the first mask layer in the array area by using the patterning processes may specifically include the following operations of S1022-1 to S1022-3.

At the operation of S1022-1, photoresist 7 may be deposited on the side of the first mask layer 5 away from the substrate 3.

At the operation of S1022-2, a pattern of the photoresist 7 may be formed by using an exposure and development process.

At the operation of S1022-3, the first mask layer 5 in the array area 1 may be removed by using the patterning processes.

Figure 7:
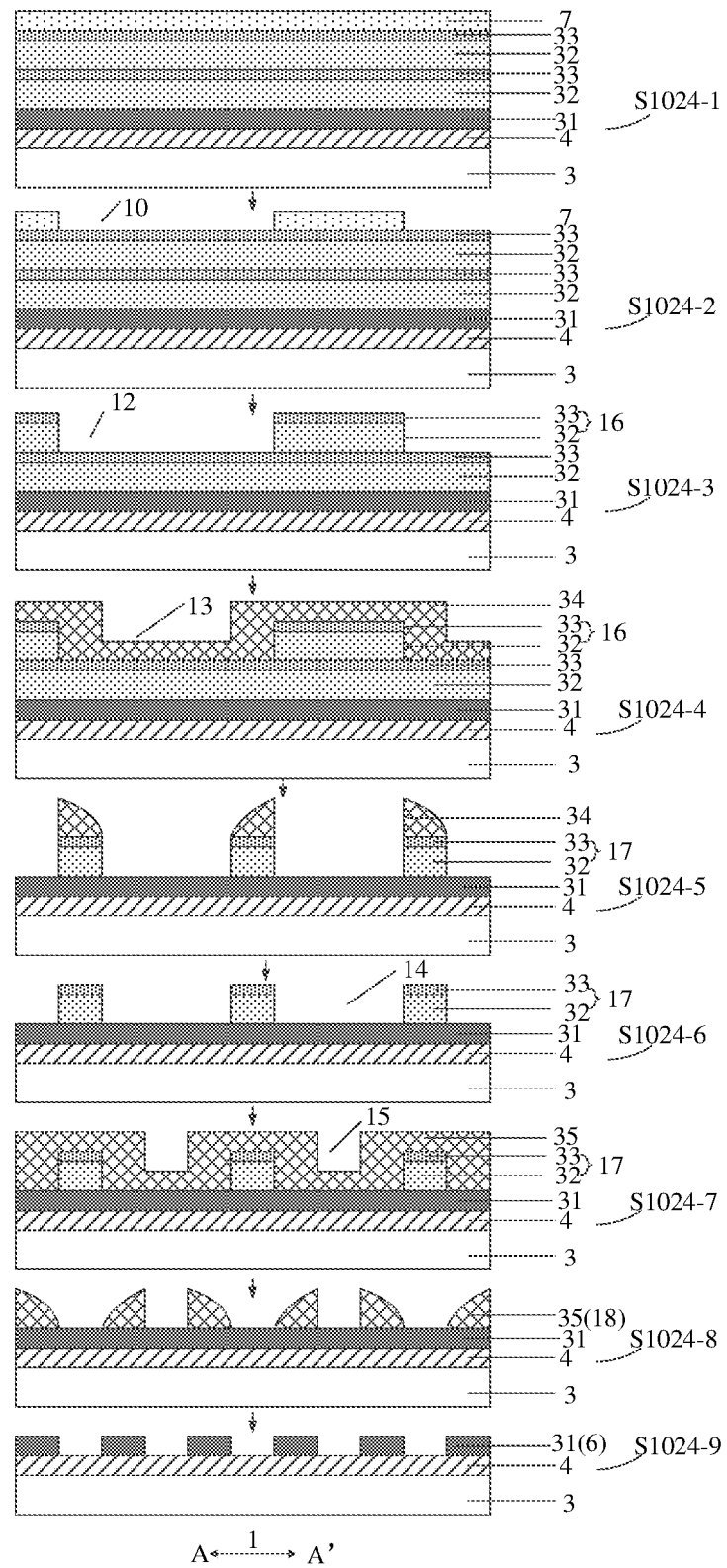
FIGS. 7 to 9 are schematic flowcharts of an operation of S1024 in a method for preparing a semiconductor device according to an embodiment of the disclosure.
Figure 8:
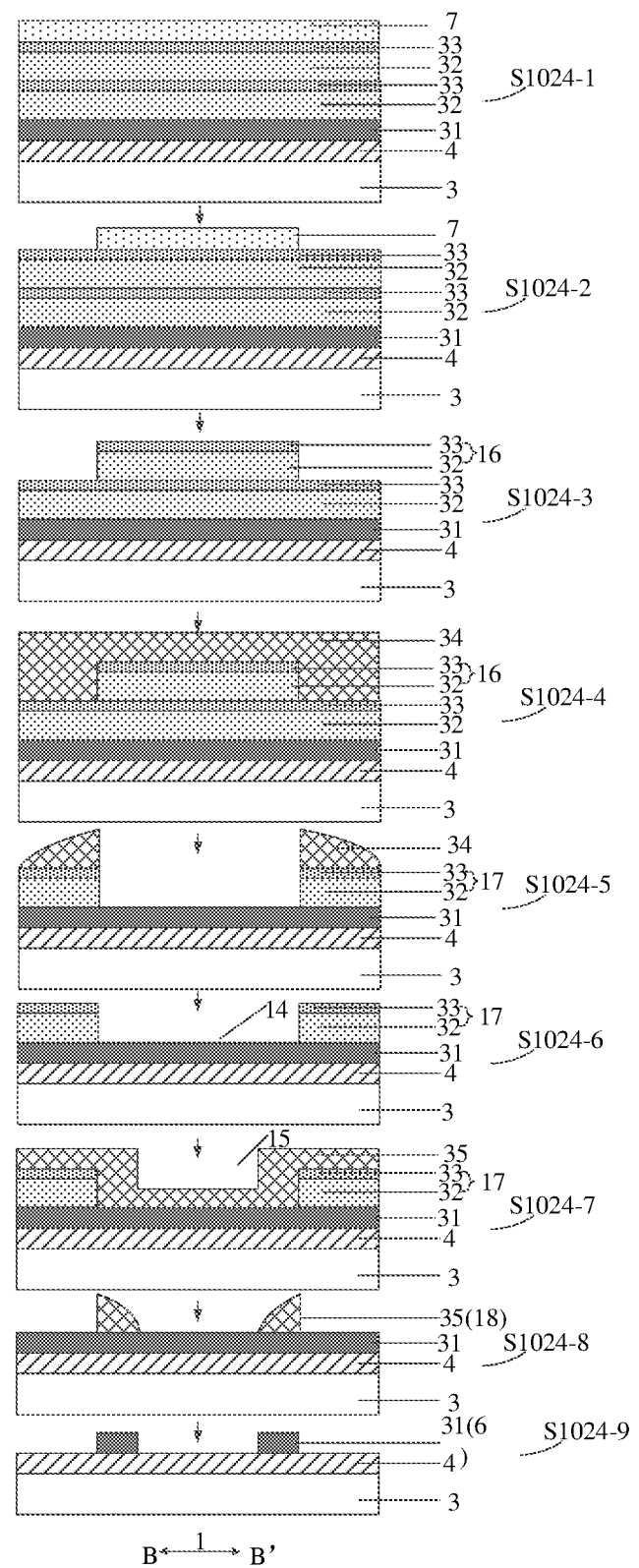
Figure 9:
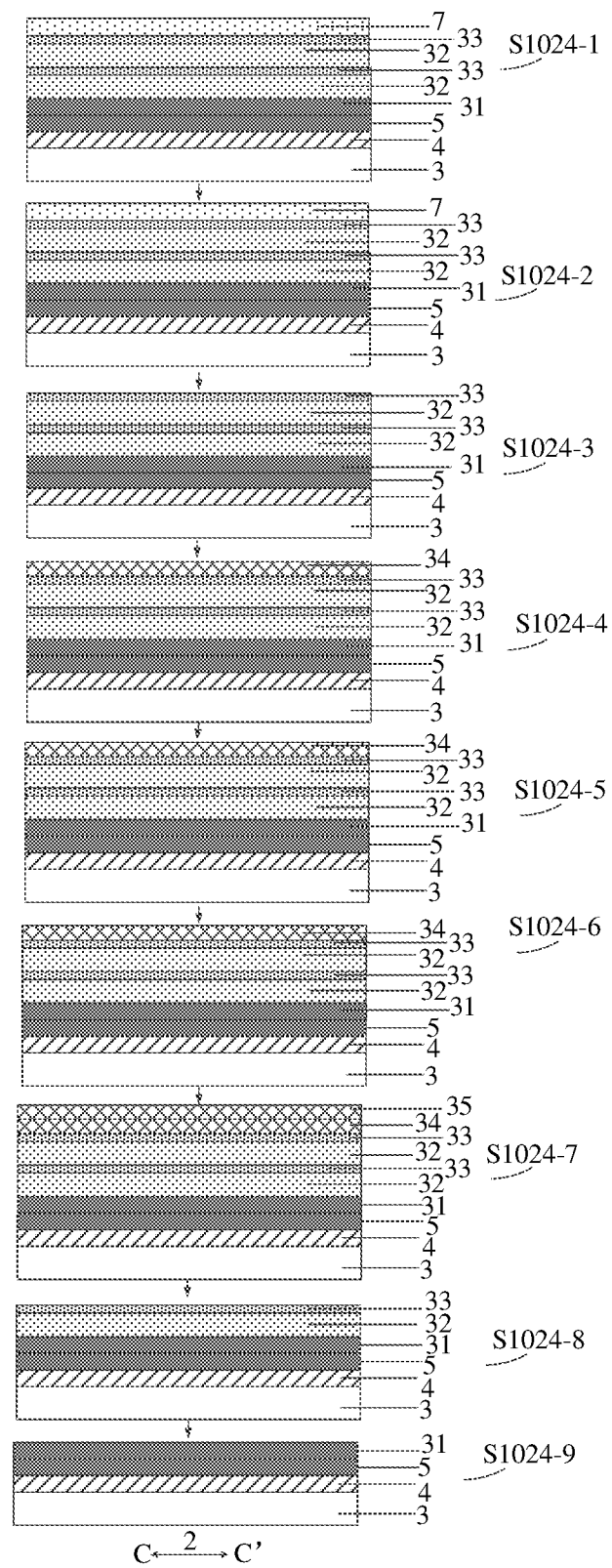

In some embodiments, as shown in FIGS. 7, 8, and 9, the operation of S1024 for forming the initial pattern in the array area on the first mask layer in the array area and reserving the first mask layer in the peripheral area may specifically include the following operations of S1024-1 to S1024-9.

At the operation of S1024-1, two groups of seventh mask layers 32 and two groups of eighth mask layers 33 may be deposited alternately on the side of the initial mask pattern 6 away from the substrate 3, and the side of an uppermost eighth mask layer 33 away from the substrate 3 may be coated with the photoresist 7.

At the operation of S1024-2, the pattern of the photoresist 7 may be formed by using the exposure and development process; and the pattern of the photoresist 7 may form a plurality of third openings 10 in the photoresist 7 in the array area.

At the operation of S1024-3, a group of the eighth mask layers 33 and a group of the seventh mask layers 32 close to the side of the photoresist 7 may be sequentially etched by using an etching process by taking the pattern of the photoresist 7 as a mask, so as to form a third mask pattern 16 in the array area 1, and remove the photoresist 7. The third mask pattern 16 may be provided with a plurality of fourth openings 12.

At the operation of S1024-4, a third covering layer 34 that covers the array area and the peripheral area may be deposited, and the third covering layer 34 may form a plurality of fifth openings 13 in an area corresponding to the plurality of the fourth openings 12.

At the operation of S1024-5, in the array area 1, by using an etching process, the third covering layer 34 and the third mask pattern 16 in the area outside the third covering layer 34 that covers the sidewall portion of the third mask pattern 16 may be removed, and a group of the eighth mask layers 33 and the seventh mask layers 32 on the side of the third mask pattern 16 towards the substrate 3 may also be removed; and a fourth mask pattern 17 may be formed by the group of eighth mask layers 33 and the seventh mask layers 32 on the side of the third mask pattern 16 towards the substrate 3.

At the operation of S1024-6, the third covering layer 34 above the fourth mask pattern 17 and in the peripheral area 2 may be removed, and the fourth mask pattern 17 may be provided with a sixth opening 14.

At the operation of S1024-7, a fourth covering layer 35 may be deposited, and a seventh opening 15 may be formed in the area corresponding to the sixth opening 14.

At the operation of S1024-8, by using the etching process, the fourth covering layer 35 in the peripheral area 2 and the group of eighth mask layers 33 and the seventh mask layers 32 close to the fourth covering layer 35 may be removed; the fourth mask pattern 17, the fourth covering layer 35 that covers the fourth mask pattern 17, and the fourth covering layer 35 in the area of the seventh opening 15 may be removed. And the fourth covering layer 35 that covers the sidewall of the fourth mask pattern 17 may be reserved in the array area 1, so as to form a fifth mask pattern 18.

At the operation of S1024-9, an initial pattern in the array area may be formed on the first mask layer 5 by using the etching process by taking the fifth mask pattern 18 as the mask, and simultaneously the eighth mask layer 33 and the seventh mask layer 32 in the peripheral area 2 may be removed by using the etching process. Then, the fifth mask pattern 18 in the array area may be removed.

According to the method for preparing the semiconductor device according to an embodiment of the disclosure, a plurality of the seventh mask layers and the eighth mask layers may be arranged alternately in sequence. And then, the initial pattern in the array area may be formed in the array area by using the first covering layer and the second covering layer through a spacing multiplication process, so that the influence of exposure precision on the initial pattern of the array area can be avoided. Therefore, the manufacturing of a small-size pattern can be realized, and the manufacturing yield of the initial pattern in the array area can be improved.

It should be noted that the thickness of the eighth mask layer may be, for example, less than the thickness of the seventh mask layer. The materials included in the first covering layer and the second covering layer may be the same.

In some embodiments, the operation of S103 for performing the at least two patterning processes on the initial mask pattern to form the first mask pattern in the array area and forming the second mask pattern in the peripheral area, may include the following operations of S1031 and S1032.

At the operation of S1031, the patterning processing may be performed on the initial mask pattern by using a first patterning process, to form first sub-mask patterns in the array area and simultaneously form a second sub-mask pattern in the peripheral area. The first sub-mask patterns may have the first height, and the second sub-mask pattern may have the second height.

At the operation of S1032, the patterning processing may be performed on the first sub-mask patterns and the second sub-mask pattern by using a second patterning process, to form the first mask pattern with the first height in the array area and simultaneously form the second mask pattern in the peripheral area. The second mask pattern may include a step-shaped structure with a first plane and a second plane. The first plane may have the second height, the second plane may have a third height, and the third height may be less than the second height.

According to the method for preparing the semiconductor device according to an embodiment of the disclosure, the mask patterns may be formed in both of the array and the peripheral area when performing each of the patterning processes on the initial mask pattern. That is, the mask pattern in the array area may be formed, and simultaneously the mask pattern in the peripheral area may be formed. The mask pattern in the peripheral area may be split to perform a plurality of patterning processes, so that the process flow and the production cost can be saved as much as possible.

In some embodiments, the sum of the third height H4 and the first height H5 may be equal to the second height H3.

In some embodiments, the first height H5 and the second height H3 may satisfy a condition that: a ratio of H5 to H3 is greater than or equal to ¼ and less than or equal to ¾.

In some embodiments, as shown in FIG. 2, the initial mask pattern of the array area 1 may include a plurality of the first patterns 36 that are arranged in a first direction X at an interval, and the first patterns 36 may be continuous patterns in a second direction Y. The first direction X may intersect the second direction Y. For example, the first direction X may be perpendicular to the second direction Y.

The initial mask pattern in the peripheral area 2 may include second patterns 37 that are continuous in the first direction X and the second direction Y.

Figure 10:
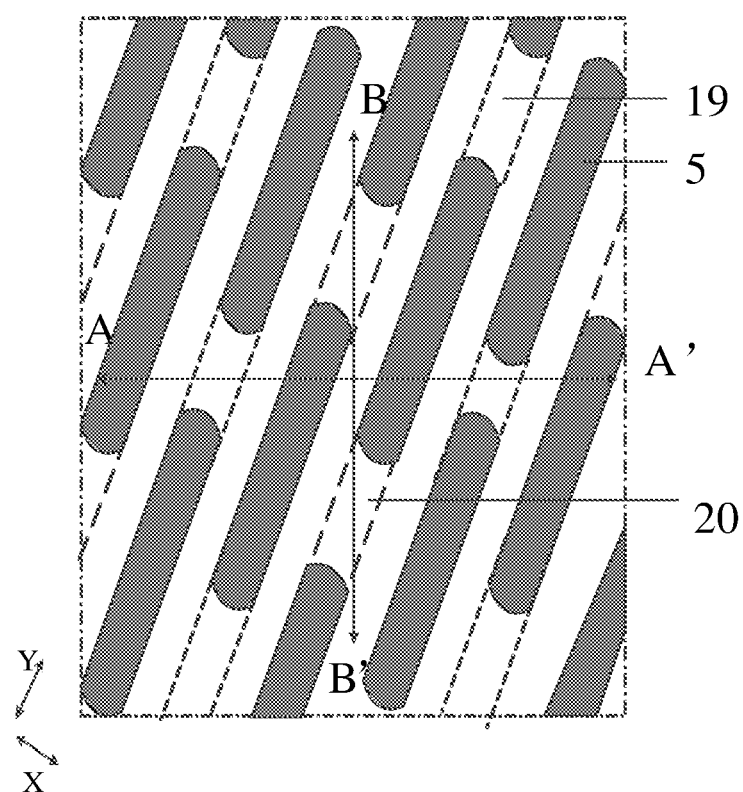
FIG. 10 is a schematic diagram of a first mask pattern according to an embodiment of the disclosure.

It should be noted that, according to the method for preparing the semiconductor device according to an embodiment, for the array area, it may be necessary to perform two patterning processes to form the first mask pattern as shown in FIG. 10. On the basis of the initial mask pattern shown in FIG. 2, the second mask layer in the first area 19 shown in FIG. 10 may be removed by using the first patterning process, so as to obtain the first sub-mask patterns. The second mask layer in the second area 20 may be removed on the basis of the first sub-mask patterns by using the second patterning process. It should be noted that FIG. 10 merely shows the part of the array area including the areas of AA' and BB'.

In some embodiments, the operation of S1031 for performing the patterning processing on the initial mask pattern by using the first patterning process, to form the first sub-mask patterns in the array area and to form the second sub-mask pattern in the peripheral area may include the following operations.

The patterning processing may be performed on the initial mask pattern in the array area in the second direction, so as to form the first sub-mask patterns arranged at a first interval in the second direction.

The patterning processing may be performed on the initial mask pattern in the peripheral area in the first direction or in the second direction. Part of the initial mask pattern may be removed in a direction perpendicular to the substrate, so as to form the second sub-mask pattern with a height difference in the peripheral area. The second sub-mask pattern may not expose the first dielectric layer in the peripheral area. The second sub-mask pattern with the height difference may include the step-shaped structure with the first plane and the second plane.

For the array area, the initial mask pattern in the first area may be removed by using the first patterning process, so that the first pattern may be disconnected in the first area to obtain the first sub-mask patterns. For the peripheral area, part of the initial mask pattern may be removed by using the first patterning process, so as to form the second sub-mask pattern of the step-shaped structure with the first plane and the second plane in the peripheral area.

In some embodiments, the operation of S1032 for performing the patterning processing on the initial mask pattern by using the second patterning process, to form the first sub-mask patterns in the array area and to form the second sub-mask pattern in the peripheral area may include the following operations.

The patterning processing may be performed on the first sub-mask pattern in the array area in the second direction, so as to form the first-mask patterns arranged at the first interval in the second direction.

The patterning process may be performed on the initial mask pattern in the peripheral area in the first direction or in the second direction. Part of the second sub-mask pattern may be removed in the direction perpendicular to the substrate, so as to form the second mask pattern in the peripheral area. The second mask pattern may expose the first dielectric layer in the peripheral area.

For the array area, the first sub-mask patterns in the second area may be removed by using the second patterning process, so that the disconnected first sub-mask patterns in the first area may be disconnected in the second area, and then the first mask pattern can be obtained.

Figure 11:
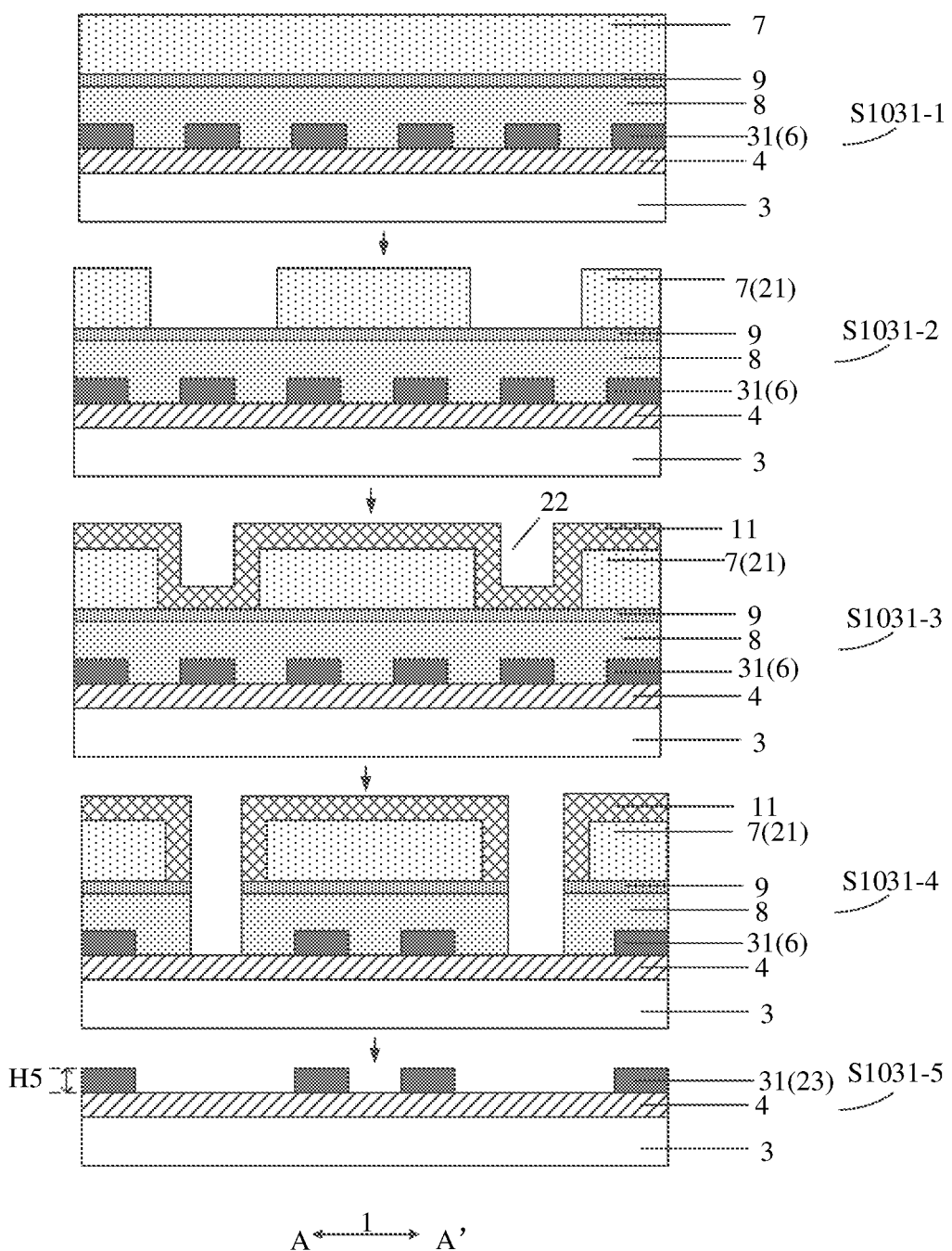
FIGS. 11 to 13 are schematic flowcharts of an operation of S1031 a method for preparing a semiconductor device according to an embodiment of the disclosure.
Figure 12:
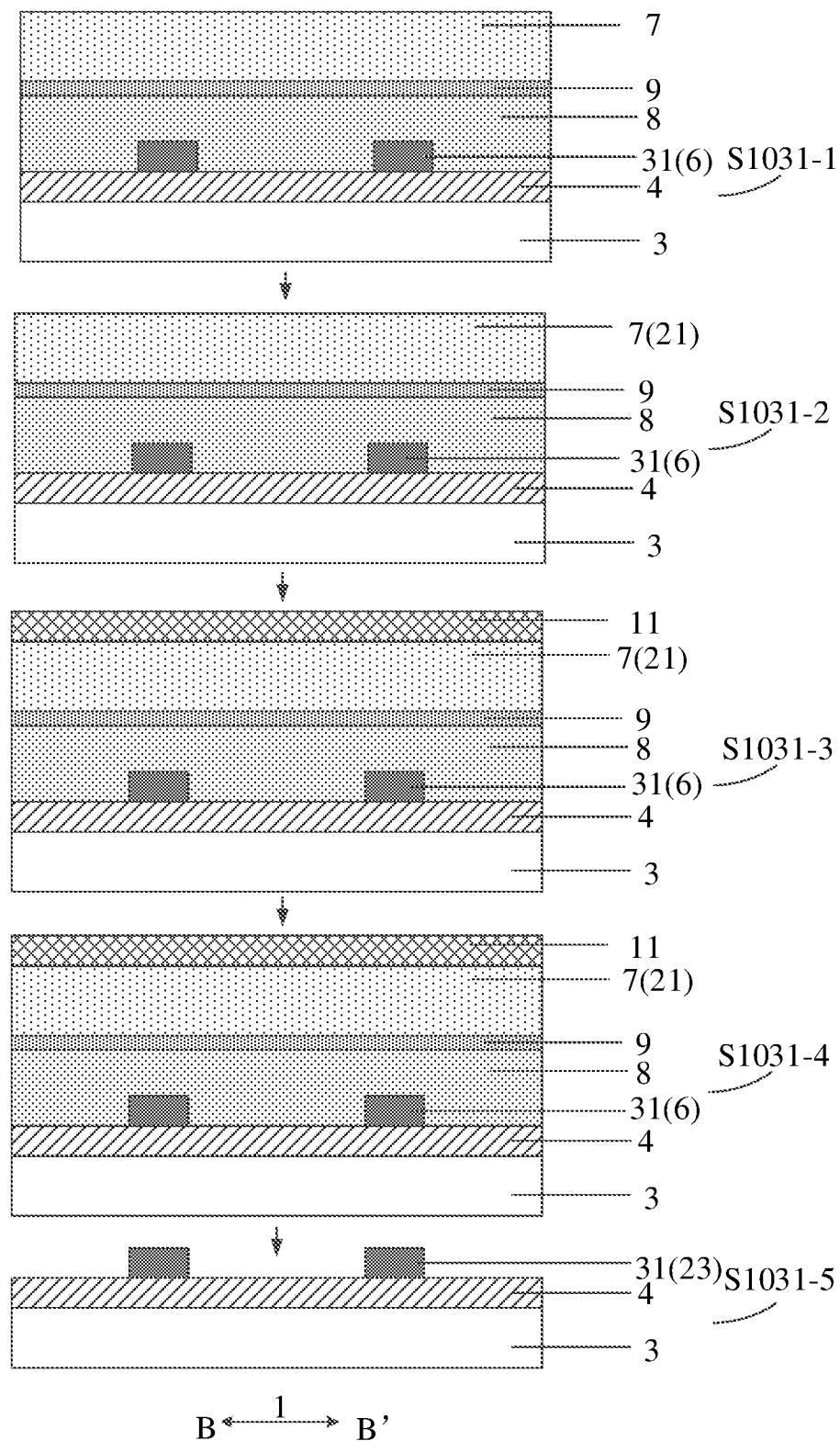
Figure 13:
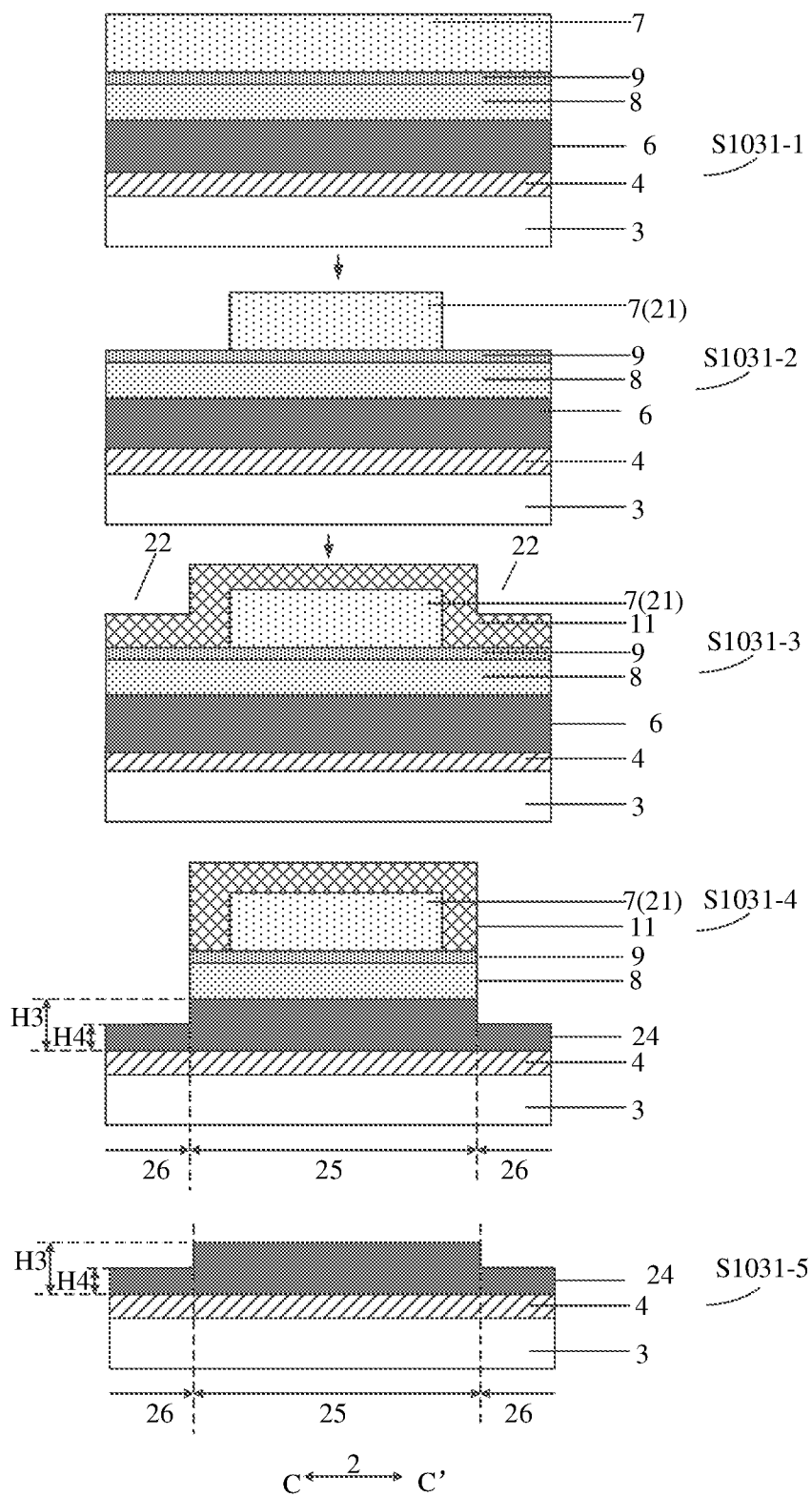

In some embodiments, as shown in FIGS. 11, 12, and 13, the operation of S1031 for performing the first patterning process may specifically include the following operations of S1031-1 to S1031-5.

At the operation of S1031-1, a third mask layer 8, a fourth mask layer 9, and photoresist 7 may be formed on the initial mask pattern 6 sequentially.

At the operation of S1031-2, an exposure and development process may be performed on the photoresist 7, to form a first photoresist pattern 21.

At the operation of S1031-3, a first covering layer 11 may be formed on the first photoresist pattern 21. The first covering layer 11 may be configured to cover the first photoresist pattern 21, the sidewall of the first photoresist pattern 21, and the fourth mask layer 9 that is not covered by the first photoresist pattern 21, so as to form a first opening 22.

At the operation of S1031-4, by using a dry etching process, a part of the first covering layer 11, a part of the fourth mask layer 9, a part of the third mask layer 8, and a part of the initial mask pattern 6 that are arranged in the area of the first opening 22 may be removed, so as to form the first sub-mask patterns 23 in the array area 1. Meanwhile, the second sub-mask pattern 24 may be formed in the peripheral area 2. The first sub-mask patterns 23 may have the first height H5. The second sub-mask pattern 24 may be configured to cover the first dielectric layer 4 in the peripheral area, and the second sub-mask pattern 24 may have a height difference, i.e., the second sub-mask pattern 24 may have the first plane and the second plane. The first plane may have a second height H3, the second plane may have a third height H4, and the third height H4 may be less than the second height H3.

At the operation of S1031-5, the remaining part of the first covering layer 11, the remaining part of the first photoresist pattern 21, the remaining part of the fourth mask layer 9, and the remaining part of the third mask layer 8 may be removed.

Figure 14:
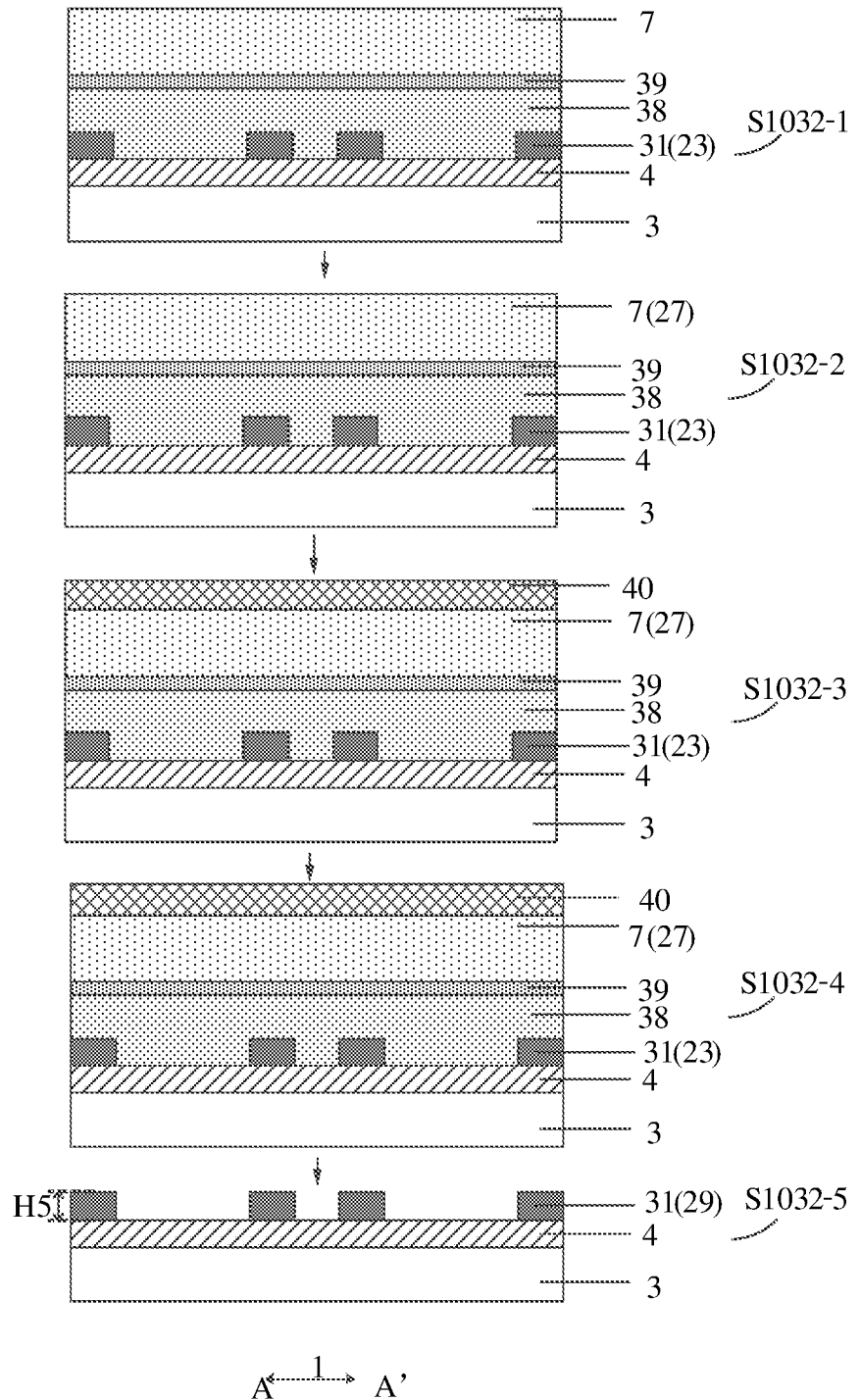
FIGS. 14 to 16 are schematic flowcharts of an operation of S1032 in a method for preparing a semiconductor device according to an embodiment of the disclosure.
Figure 15:
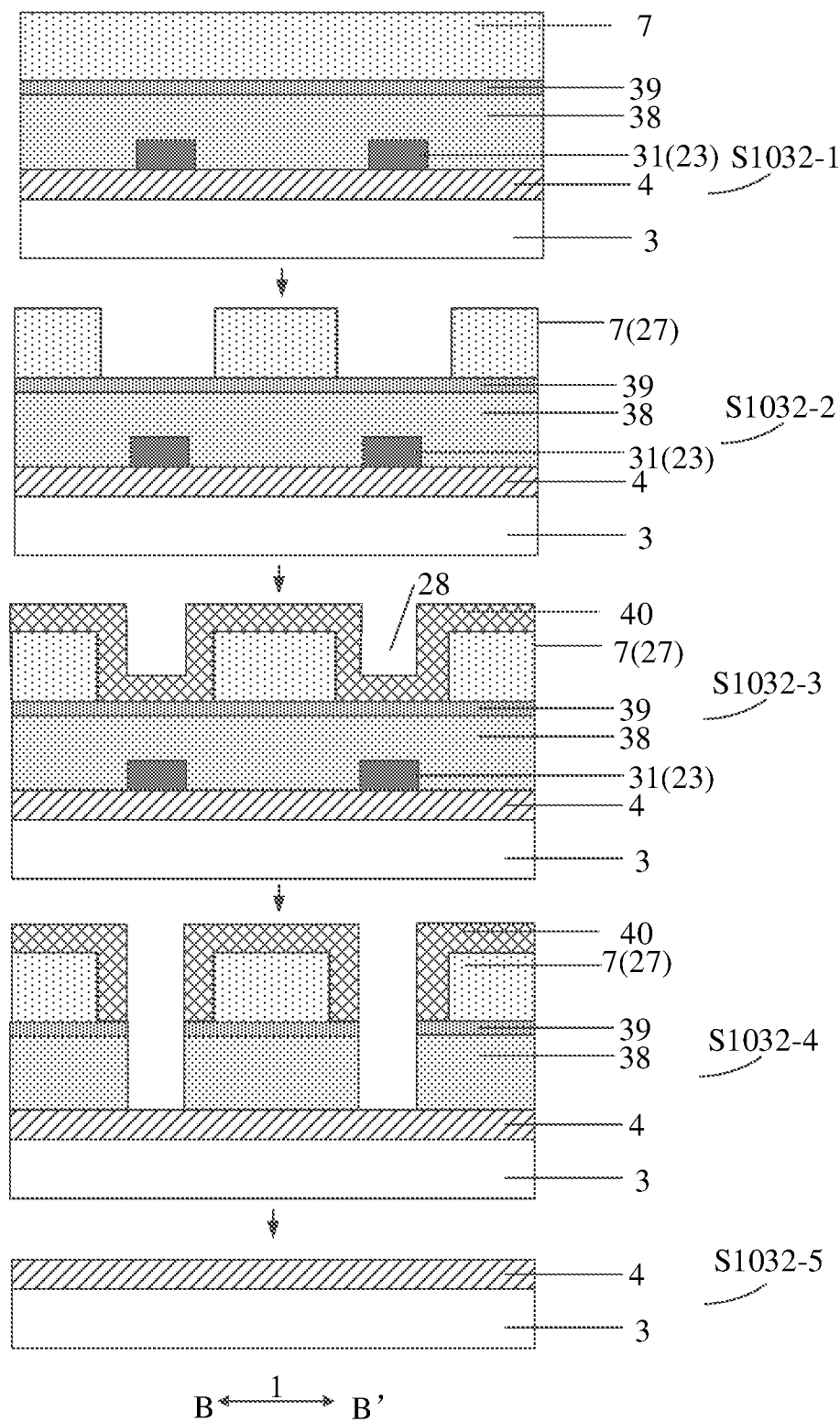
Figure 16:
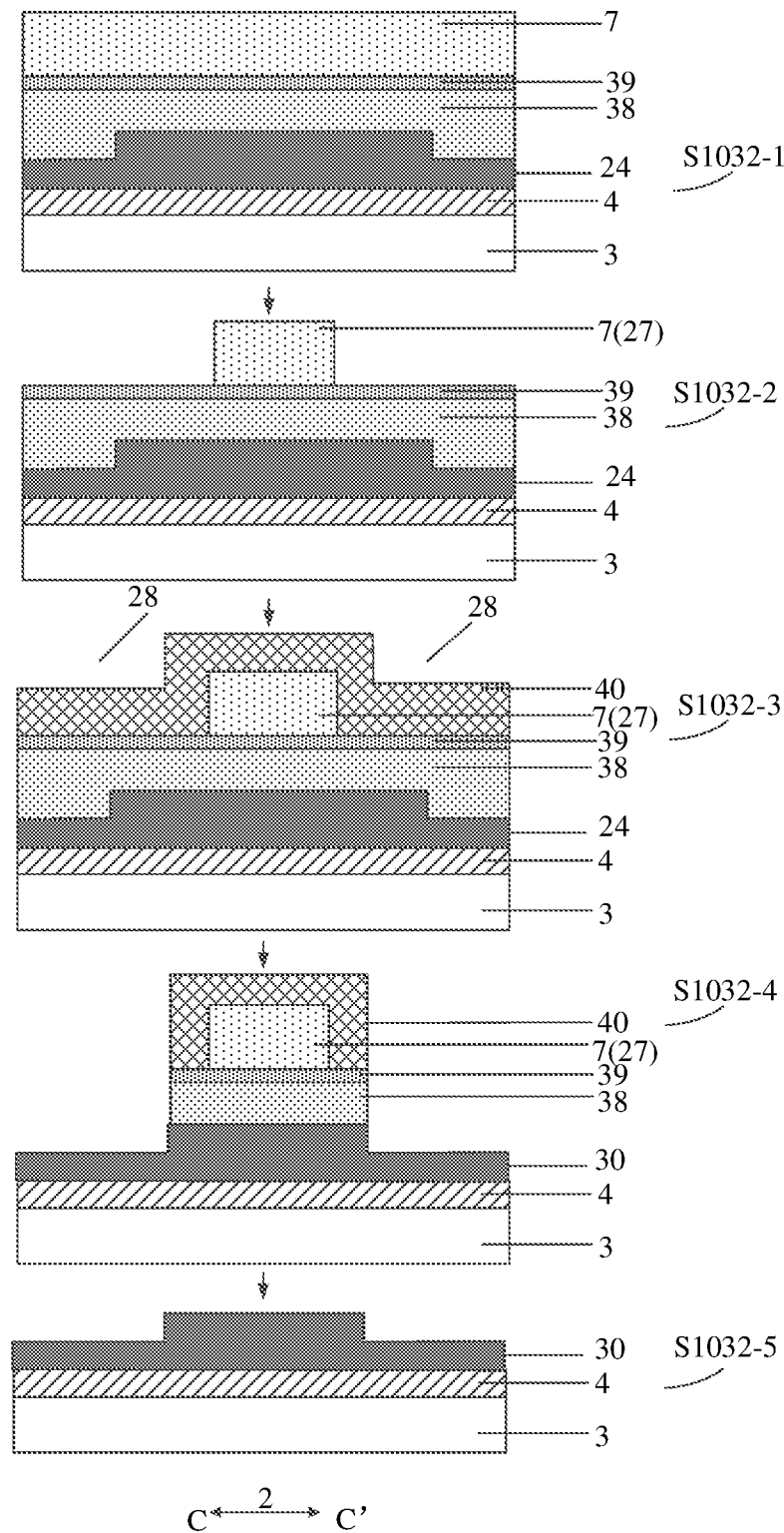

In some embodiments, as shown in FIGS. 14, 15, and 16, the operation of S1032 for performing the first patterning process may specifically include the following operations of S1032-1 to S1032-5.

At the operation of S1032-1, a fifth mask layer 38, a sixth mask layer 39, and the photoresist 7 may be formed sequentially on the first sub-mask patterns 23 and a second sub-mask pattern 24.

At the operation of S1032-2, the exposure and development process may be performed on the photoresist 7 to form the second photoresist pattern 27.

At the operation of S1032-3, a second covering layer 40 may be formed on the second photoresist pattern 27. The second covering layer 40 may be configured to cover the second photoresist pattern 27, a sidewall of the second photoresist pattern 27 and the sixth mask layer 39 that is not covered by the second photoresist pattern 27, so as to form a second opening 28.

At the operation of S1032-4, by using the dry etching process, a part of the second covering layer 40, a part of the sixth mask layer 39, a part of the fifth mask layer 38, and a part of the first sub-mask patterns 23 or the second sub-mask pattern 24 that are arranged in an area of the second opening 28 may be removed, so as to form the first mask pattern 29 in the array area 1. Meanwhile, the second mask pattern 30 may be formed in the peripheral area 2. The second mask pattern may include the step-shaped structure with a first plane and a second plane.

At the operation of S1032-5, a remaining part of the second covering layer 40, a remaining part of the second photoresist pattern 27, a remaining part of the sixth mask layer 39, and a remaining part of the fifth mask layer 38 may be removed.

It should be noted that FIGS. 11 and 14 are schematic flowcharts of the operation for performing a subsequent preparation process on the cross section of AA' shown in FIG. 2. FIGS. 12 and 15 are schematic flowcharts of the operation for performing a subsequent preparation process on the cross section of BB' shown in FIG. 2. FIGS. 13 and 16 are schematic flowcharts of the operation for performing a subsequent preparation process on the cross section of CC' shown in FIG. 2.

In some embodiments, the materials of the third mask layer, the fifth mask layer, and the seventh mask layer may be the same. The materials of the fourth mask layer, the sixth mask layer, and the eighth mask layer may be the same. The materials of the third mask layer, the fifth mask layer, and the seventh mask layer may be different from the materials of the fourth mask layer, the sixth mask layer, and the eighth mask layer. The materials of the third mask layer, the fifth mask layer, and the seventh mask layer may be different from the materials of the first mask layer and the second mask layer.

In some embodiments, the materials of the third mask layer, the fifth mask layer, and the seventh mask layer may include a Bottom Anti-Reflection Coating (BARC).

The materials of the fourth mask layer, the sixth mask layer, and the eighth mask layer may include Silicon Oxynitride (SiON).

It should be noted that the BARC may develop, which facilitates the removal of the third mask layer, the fifth mask layer, and the seventh mask layer.

In some embodiments, the materials of the first covering layer, the second covering layer, the third covering layer, and the fourth covering layer may be the same.

In some embodiments, the materials of the first covering layer, the second covering layer, the third covering layer, and the fourth covering layer may include Silicon Dioxide ($SiO_2$).

In some embodiments, the substrate according to an embodiment of the disclosure may be a semiconductor substrate. In the specific implementation, the semiconductor substrate may include, but is not limited to, for example, substrates that are usually used in the field of semiconductors, such as Silicon (Si), Germanium (Ge), and SiGe.

In some embodiments, the material of the first dielectric layer may include silicon oxide.

It should be noted that, in the specific implementation, the method for preparing the semiconductor device according to the embodiments of the disclosure may be used. After forming the first mask pattern and the second mask pattern, the step of transferring the first mask pattern and the second mask pattern to the substrate may further be included. Therefore, the areas corresponding to the first mask pattern and the second mask patterns may be active areas of the semiconductor; and the area, other than the first mask pattern and the second mask pattern, on the substrate may be the conductive area (i.e., the source and drain contact area). The first mask layer may be removed after transferring the first mask pattern and the second mask pattern to the substrate. A subsequent method for preparing the semiconductor device may further include steps of forming a gate electrode, a source electrode, and a drain electrode, a capacitor, a word line, a bit line, etc.

Embodiments of the disclosure further provide a semiconductor device. The semiconductor device is prepared by the method for preparing the semiconductor device according to the embodiments of the disclosure.

In the specific implementation, the semiconductor device includes a substrate, a first dielectric layer, a gate electrode, a source electrode, a drain electrode, a capacitor, a word line, a bit line, etc. The pattern in the active area of a conductor of the substrate is transferred by using the first mask pattern and the second mask pattern obtained by the method for preparing the semiconductor device according to the embodiments of the disclosure.

In some embodiments, the semiconductor device according to the embodiments of the disclosure may be applied to the DRAM.

In conclusion, according to the semiconductor device and the method for preparing the semiconductor device according to the embodiments of the disclosure, a complete mask pattern may be obtained by at least two patterning processes including the exposure, i.e., the mask pattern in the peripheral area may be split, and a complex mask pattern may be split into a plurality of simple patterns for exposing several times. Therefore, the optical proximity effect can be reduced, the rounded corners of the mask pattern in the peripheral area can be avoided, and the appearance of the mask pattern of the peripheral area can be improved, thereby improving the manufacturing yield of the mask pattern in the peripheral area, and also reducing the leakage current of the semiconductor device.

It is apparent that those skilled in the art can make various modifications and variations to the present application without departing from the spirit and scope of the disclosure. Thus, if such modifications and variations of the disclosure fall within the scope of the appended claims and their equivalents, the disclosure is also intended to cover the modifications and variations.

The invention claimed is:

1. A method for preparing a semiconductor device, comprising:
    providing a substrate, and forming a first dielectric layer on one side of the substrate, wherein the substrate comprises an array area and a peripheral area arranged outside of the array area;
    forming an initial mask pattern on the first dielectric layer;
    wherein forming the initial mask pattern on the first dielectric layer comprises:
    forming a first mask layer on the first dielectric layer;
    removing the first mask layer in the array area by using the at least two patterning processes;
    forming a second mask layer that covers the array area and the peripheral area; and
    forming an initial pattern in the array area on the second mask layer in the array area by using the at least two patterning processes, and reserving the first mask layer and the second mask layer in the peripheral area to obtain the initial mask pattern, wherein both of a material of the first mask layer and a material of the second mask layer comprise Polyethylene (PE);
    and
    performing at least two patterning processes on the initial mask pattern, to form a first mask pattern in the array area and to form a second mask pattern in the peripheral area;
    wherein the first mask pattern has a first height, the second mask pattern has a second height, and the second height is greater than the first height; wherein both of the array area and the peripheral area are exposed by using each of the at least two patterning processes.

2. The method of claim 1, wherein
a thickness of the second mask layer and a total thickness of the first mask layer and the second mask layer in the peripheral area both satisfy a condition that: a ratio of the thickness of the second mask layer to the total thickness of the first mask layer and the second mask layer is greater than or equal to ¼ and less than or equal to ¾.

3. The method of claim 2, wherein
the thickness of the second mask layer is equal to the first height; and
wherein the total thickness of the first mask layer and the second mask layer is equal to the second height.

4. The method of claim 1, wherein
the material of the first mask layer is the same as the material of the second mask layer.

* * * * *